(12) United States Patent
Desieres et al.

(10) Patent No.: US 9,412,904 B2
(45) Date of Patent: Aug. 9, 2016

(54) STRUCTURED SUBSTRATE FOR LEDS WITH HIGH LIGHT EXTRACTION

(71) Applicants: Commissariaat a l'energie atomique et aux ene alt, Paris (FR); SOITEC, Bernin (FR)

(72) Inventors: Yohan Desieres, Lans En Vercors (FR); Philippe Gilet, Teche (FR); Pascal Guenard, Froges (FR)

(73) Assignees: Commissariat a l'energie atomique et aux energies alternatives, Paris (FR); Soitec, Bernin (FR)

( * ) Notice: Subject to any disclaimer, the term of this patent is extended or adjusted under 35 U.S.C. 154(b) by 0 days.

(21) Appl. No.: 14/370,903

(22) PCT Filed: Jan. 4, 2013

(86) PCT No.: PCT/EP2013/050109
§ 371 (c)(1),
(2) Date: Jul. 7, 2014

(87) PCT Pub. No.: WO2013/102664
PCT Pub. Date: Jul. 11, 2013

(65) Prior Publication Data
US 2015/0001568 A1      Jan. 1, 2015

(30) Foreign Application Priority Data
Jan. 5, 2012    (FR) ...................... 12 50130

(51) Int. Cl.
*H01L 33/58*       (2010.01)
*H01L 33/00*       (2010.01)
(Continued)

(52) U.S. Cl.
CPC .............. *H01L 33/22* (2013.01); *G02B 5/0236* (2013.01); *G02B 5/0284* (2013.01);
(Continued)

(58) Field of Classification Search
None
See application file for complete search history.

(56) References Cited

U.S. PATENT DOCUMENTS 6,657,236 B1    12/2003    Thibeault et al.
2004/0041164 A1  3/2004    Thibeault et al.
(Continued)

FOREIGN PATENT DOCUMENTS

| EP | 2 151 852 A1 | 2/2010 |
| EP | 2 280 427 | 2/2011 |
| JP | 2009 54882 | 3/2009 |

OTHER PUBLICATIONS

International Search Report Issued Jun. 10, 2013 in PCT/EP13/050109 Filed Jan. 4, 2013.
(Continued)

*Primary Examiner* — Calvin Choi
*Assistant Examiner* — Xiaoming Liu
(74) *Attorney, Agent, or Firm* — Oblon, McClelland, Maier & Neustadt, L.L.P.

(57) ABSTRACT

A device for back-scattering an incident light ray, including: a host substrate; a structured layer; a first face in contact with a front face of the host substrate; a second flat face parallel to the first face; a first material and a second material which form, in a mixed plane, alternating surfaces at least one of whose dimensions is between 300 nm and 800 nm, the mixed plane is between the first and second face of the structured layer; wherein the refractive index of the first and of the second material are different, the structured layer is covered by a specific layer, the specific layer is made of a material which is different from the first and second materials of the structured layer, and the specific layer is crystalline and semiconductive.

27 Claims, 10 Drawing Sheets

(51) Int. Cl.
*H01L 33/22* (2010.01)
*H01L 33/10* (2010.01)
*H01L 33/46* (2010.01)
*G02B 5/02* (2006.01)
*H01L 33/32* (2010.01)

(52) U.S. Cl.
CPC ............ *H01L 33/005* (2013.01); *H01L 33/10* (2013.01); *H01L 33/46* (2013.01); *H01L 33/32* (2013.01); *H01L 2933/0025* (2013.01); *H01L 2933/0058* (2013.01)

(56) References Cited

U.S. PATENT DOCUMENTS

| | | | |
|---|---|---|---|
| 2005/0145872 | A1 | 7/2005 | Fang et al. |
| 2006/0157719 | A1* | 7/2006 | Kwak ................ H01L 21/0242 257/95 |
| 2007/0187698 | A1 | 8/2007 | Lee et al. |
| 2008/0169482 | A1* | 7/2008 | Kang ................ H01L 33/10 257/98 |
| 2009/0166668 | A1* | 7/2009 | Shakuda ................ B82Y 20/00 257/103 |
| 2009/0206357 | A1* | 8/2009 | Ito ................ H01L 33/38 257/99 |
| 2009/0272993 | A1 | 11/2009 | Cheong |
| 2010/0059663 | A1 | 3/2010 | Desieres |
| 2010/0163912 | A1 | 7/2010 | Lee et al. |
| 2011/0108798 | A1 | 5/2011 | Song |
| 2011/0216229 | A1 | 9/2011 | Mary et al. |
| 2012/0043522 | A1* | 2/2012 | Yan ................ H01L 33/007 257/13 |
| 2012/0305974 | A1 | 12/2012 | Cheong |

OTHER PUBLICATIONS

U.S. Appl. No. 14/362,479, filed Jun. 3, 2014, Dussaigne, et al.
Search Report issued Nov. 6, 2012 in French Patent Application No. FR 1250130 (with English translation of category of cited documents) (all references previously filed).
Tae Sun Kim, et al., "Increase of light extraction from GaN based light emitting diodes incorporating patterned structure by colloidal lithography", AIP, Applied Physics Letters, 91, (17), 2007, p. 17114-1 to 17114-3,.
Takashi Mukai, et al., "GaN-based Light-Emitting Diodes suitable for White Light", Light-Emitting Diodes: Research, Manufacturing, and Applications VII, Proceedings of SPIE, vol. 4996, 2003, p. 156-165.
Robert Magnusson, et al., "Physical basis for wideband resonant reflectors", Mar. 3, 2008, vol. 16, No. 5, Optics Express, p. 3456-3462.
T. Fujii, et al., "Increase in the extraction efficiency of GaN-based light-emitting diodes via surface roughening", Applied Physics Letters, vol. 84, No. 69, Feb. 2004, 4 pages.
U.S. Appl. No. 13/061,935, filed May 25, 2011, Mary et al.

\* cited by examiner

STRUCTURED SUBSTRATE FOR LEDS WITH HIGH LIGHT EXTRACTION

TECHNICAL FIELD

The technical field of the invention relates to multi-layer light-emitting devices, especially diode-type electroluminescent devices or LEDs.

THE STATE OF THE PRIOR ART

An electroluminescent diode 1 is composed of several layers laid on top of a substrate (FIG. 1). This multi-layer structure comprises at least one active layer which emits light, the wavelength of which depends on its composition. For example, light-emitting diodes based on gallium nitride (GaN) alloys may emit between 360 nm and 580 nm.

In order to do this they comprise at least three semi-conductive layers formed by epitaxy on a substrate 2, usually made of sapphire. The active layer 6, doped with indium ($In_xGa_{(1-x)}N$), separates a first n-type doped layer 4 from a second p-type doped layer 7. The doping increases the number of negative (n-type doping) or positive (p-type doping) electrical charge carriers 8. The charge carriers are supplied by a voltage source, connected to the doped layers by means of electrodes 5. By their nature, p-type doped layers are less conductive than n-type doped layers. In order to ensure a homogeneous distribution of charges in a p-type doped layer, a semi-transparent conductive layer 9 connected to the electrode 5 may cover its surface. Hence opposite electrical charges, brought about by the electrodes, migrate towards the centre of the multi-layer structure to combine at a point 10 of the active structure, whilst emitting light in random directions (FIG. 2).

One of the problems inherent in this type of device is that a significant amount of light is trapped in the multi-layer structure by successive reflections at the interfaces. More precisely, the photons 11' and 11" emitted by the active layer 6 do not reach the external environment 100, due to the phenomenon of total reflection on the optical surfaces 12 or 13 which separate the active layer from the external environment. The reflected photons are then absorbed by the electrical contacts 5 or the doped layers (by excitation of the free charge carriers) or by structural defects in the active layer 4.

For diodes which emit in the above range of wavelengths, the layers composed of gallium nitride have a refractive index of the order of 2.45. The limiting angle of incidence or critical extraction angle (CEA) allowing a photon 11 to cross the interface 13, is of the order of 24° when the multi-layer structure is placed in air.

This angle only allows between 4 and 5% of the light to be emitted directly to the exterior of the device 1.

It is therefore essential to increase this value, in order to increase the electro-optical conversion efficiency of these multi-layer structures.

A first technique involves modifying the structure of the interface 13 which separates a p-type doped layer of the device from the external environment 100 (FIG. 3). The interface 13 may be constituted of facets at various orientations, so that the extraction field angle range is greater. In other words, this face 13 is structured in order to limit the process of total reflection of photons at the interface 13. Nevertheless, the use of this technique is not compatible with ensuring that the electrical properties of the P-type doped layer are preserved. In effect, in order to achieve better extraction efficiency, the structuring must be as deep as possible, thus adversely affecting the conduction properties of the structured layer and the overall efficiency of the device.

It is also known to those skilled in the art that the semi-transparent conductive layer 9 can be structured instead of the p-type doped layer, in order to preserve the electrical properties of the latter (Applied Physics Letters, Vol. 91, Num. 17, p. 17114-1 to 17114-3, 2007). This alternative involves inverting the p-type doped layer with the n-type doped layer (FIG. 4) (Applied Physics Letters Vol. 84, Num. 69, p. 855, February 2004). The p-type doped layer 7 is then electrically connected to a voltage source through a metallic layer 15, interposed between the substrate 2 and the layer 7. The metallic layer may also act as a mirror to reflect the photons towards the external environment 100. This technique requires a step for transferring the multi-layer structure (3, 6, 7) onto the support 2. This step is costly and critical, due to the risk of damage to the multi-layer structure during turning it over and because of the heat necessary to maintain the multi-layer structure on the metallic layer by brazing.

Another alternative involves not inverting the structure and carrying out the structuring at the interface 14, between the n-type doped layer 4 and the substrate 2 (FIG. 5) ("GaN-based Light-Emitting Diodes suitable for White Light", Proceedings of SPIE Vol. 4996, pp 156-165).

Thus a first part 4a of the layer formed by epitaxy on the substrate 2 fits the shape of the structured face 14. This manufacturing technique has the drawback of being technologically difficult to carry out, particularly with hard materials such as sapphire. The deposited layer 4 and the substrate 2 may also be of different natures, thus creating a zone of lattice mis-match between these materials during the formation of the layer 4. An additional thickness of layer 4b must therefore be formed so that the structure of the active layer 6 is not influenced or disturbed by the interface 14. The term thickness in the present document designates the distance separating the largest surfaces of a layer or of several superimposed layers. Another drawback appears when the refractive index of the substrate tends towards that of the n-type doped layer, favouring the diffusion of photons into the substrate. In order to limit this effect, it is necessary to metallise the faces of the substrate which are not in contact with the doped layer, or to collect the photons by other means, for example by the use of a reflecting mirror.

The objectives of the invention are to increase the electro-optical conversion efficiency of an LED type electroluminescent device, to reduce its production costs whilst limiting the risk of damaging it during its manufacture. In other words, the invention hopes to resolve the following problems:
- to reduce the thickness of the lattice mis-match areas present between the various layers which constitute the electroluminescent device, especially at the interfaces of doped layers and of the active layer,
- and/or to reduce the current density at the active layer,
- and/or to increase the proportion of photons emitted to the exterior of the electroluminescent device,
- and/or to make such a device without an inversion step,
- and/or to reduce the cost of manufacturing such a device.

PRESENTATION OF THE INVENTION

The above-stated aims are achieved by means of a device for reflection or for back-scattering of at least one incident light ray, comprising a host substrate and a layer referred to as a structured layer which comprises:
- a first face in contact with a front face of the host substrate;
- a second flat face which is parallel or substantially parallel to the first face;

a first material A and a second material B, which form surfaces, in a plane referred as the mixed plane, at least one of whose dimensions may be between 300 nm and 800 nm, where the mixed plane is between the first and second face of the structured layer;

where the refractive indices of the first and of the second material are different.

Preferably, the mixed plane is parallel or substantially parallel to the first and/or the second face of the structured layer. Optionally the mixed plane may coincide with the first or second face of the structured layer.

The first and the second material may alternate along one or two dimensions in the mixed plane in order to create a variation of the refractive index in said plane. This variation in the refractive index allows back-scattering of a light ray which is incident on the mixed plane.

In the mixed plane the first and second materials form amorphous or structured patterns, whose dimensions may be between 300 nm and 800 nm, or between 350 nm and 600 nm, preferably of the order of the wavelength of the incident light ray. The dimensions may be measured along an axis comprised in the mixed plan. The measurements of the dimensions preferably correspond to the distance separating two opposite edges of a given pattern.

Optionally a mixed plane may comprise more than two materials of different refractive indices and which meet the above conditions.

A mixed plane may be parallel and in contact with other mixed planes, so as to form a mixed volume whose thickness may be defined along an axis normal to one of these planes. The thickness may also be defined as being the distance separating the largest surfaces of a layer or of several superimposed layers.

This mixed volume may comprise the first and/or second surface of the structured layer.

The first and second face of the structured layer are separated by a distance which allows at least one photon belonging to an incident light ray to interact by diffusion and/or by refraction with at least one mixed plane or a mixed volume. For example, the distance separating the first and second face of the structured layer may be between 50 nm and 500 nm.

The first material may have a refractive index which is less than the second material, whose value may be greater than or equal to 2.

Preferably the absolute value of the difference between the refractive indices of the first and of the second material divided by one of above refractive indices is greater than 0.1.

The first material or the second material may absorb less than 30%, or less than 20%, or less than 10% of an incident light ray, passing only through this material and optionally, passing through the first and the second surface of the structured layer.

In other words, one of the above materials may have a refractive index of which the imaginary part is as small as possible whilst remaining relatively transparent, so as to have the least possible adverse effect on the intensity of the light ray which is incident on the mixed plane or mixed volume.

Preferably the imaginary part of the refractive index of one of the above materials is as low as possible, so that the loss of intensity by absorption does not exceed 30%, or 20% or 10% of the intensity of the light ray passing through it.

The materials comprising the structured layer may be insulating or semi-conductive.

They may be made of materials with a high refractive index such as, for example, titanium oxide ($TiO_2$) or tantalum oxide ($Ta_2O_5$) or zinc oxide (ZnO) or zinc sulphide (ZnS); and/or from materials of low refractive index such as silica ($SiO_2$)

The host substrate may be formed from a semi-conductive or insulating material, for example from sapphire, or from alumina ($Al_2O_3$), or from silicon (Si), or from aluminium nitride (AlN), or from mono- or polycrystalline silicon carbide (SiC).

The host substrate and the structured layer form a structured substrate which can back-scatter, that is reflect and/or refract, an incident light ray at the structured layer. More precisely, the light ray may be back-scattered at a mixed plane or a mixed volume.

The structured substrate can comprise a metallic layer arranged between the host substrate and the structured layer or in contact with the host substrate and/or the structured layer, in order to limit the passage of the incident light ray between these two elements.

The metallic layer may be made of tungsten (W). Other metals may be employed, characterised by improved reflectivity when they are thermally treated at temperatures above 800° C. such as, for example, molybdenum (Mo), or tantalum (Ta), or niobium (Nb) or chromium (Cr), or titanium (Ti) or silicon (Si) or titanium nitride (TiN).

Advantageously, in order to achieve reflectivity greater than the metallic layers mentioned above, a dielectric multi-layer may be substituted for a metallic layer. A multi-layer may comprise the following elements: alumina ($Al_2O_3$) and silica ($SiO_2$); or titanium oxide ($TiO_2$) and silica ($SiO_2$).

An above metallic layer or a dielectric multi-layer may be interposed between the first and the second material in the structured layer, so as to separate the various optical zones.

The metallic layer and/or the dielectric multi-layer may have a thickness of between a few nanometers and a few hundred nanometers, for example of the order of 100 nm. Its reflection coefficient is preferably greater than 10%.

The structured layer is preferably covered with a layer, called the specific layer, which is crystalline, semi-conductive and optionally flat. Its thickness may be less than one micrometer or less than 500 nm. It may be between a few nanometers and several hundred nanometers, for example between 5 nm and 200 nm, or between 5 nm and 50 nm or between 50 nm and 200 nm. It may comprise nitride or aluminium or indium gallium nitride or an alloy made from these elements. The refractive index of this specific layer is advantageously close to or identical to the refractive index of the first or of the second material of the structured layer, in order to favour the propagation of an incident ray up to a mixed plane.

Preferably the maximum difference between the refractive index of the specific layer and of one of the above layers is less than 30%, or 20%, or 10%.

The material whose refractive index is the greater of material A and material B is preferably in contact with the specific layer.

The specific layer may comprise, or be constituted of, a material C which is different from material A and/or material B. Preferably the specific layer is made of a material C which is different from material A and from material B which make up the structured layer.

Advantageously, the specific layer is a layer composed of gallium nitride and of nitrogen (InGaN). It may also comprise gallium nitride or silicon carbide or silicon, or indium gallium nitride.

The specific layer may be transferred onto the structured layer, thus the compensation zone for the lattice mismatch is of lower thickness in comparison with, for example, a layer formed by epitaxy on the structured layer.

The specific layer is preferably non-stressed, that is to say, its crystalline structure is homogeneous and non-deformed.

In other words, the state of the specific layer is relaxed, in order to favour the formation on one of its faces of a first layer by an epitaxy technique.

In other words, an LED type multi-layer structure with reduced thickness may be formed on one the above back-scattering devices through the use of the specific layer.

The first layer may belong to an LED type multi-layer structure, so as to form a light emitting device arranged on one of the above devices for back-scattering of an incident light ray, where the first layer is in contact with one of said back-scattering devices.

This first layer is crystalline and preferably its lattice parameter is close to, similar to or identical to that of the structured layer. Thus the lattice mis-match zone between these two layers is as small as possible, and preferably the differences between their lattice parameters are less than 1%.

The thickness of the first layer may be greater than 100 nm or between 100 nm and 1 μm. It may include gallium nitride or an alloy of aluminium and gallium nitride. The first layer may optionally be p- or n-type doped.

Preferably the first layer is composed of nitrogen and gallium nitride ($In_xGa_{(1-x)}N$), in order to favour the growth on one of its faces, by an epitaxy technique, of an indium gallium nitride based active layer, which belongs to the LED-type multi-layer structure.

The thickness of the active layer may be less than 200 nm or 150 nm or 100 nm.

When an electric current passes through the active layer, it may emit at least one light ray in the visible region or between 360 nm and 700 nm, preferably between 430 nm and 500 nm.

The active layer may separate the first crystalline semi-conductive layer, for example n-type doped, and a second crystalline semi-conductive p-type doped layer, the assembly forming an electroluminescent diode or LED-type multi-layer structure.

The alternation of the refractive index at an above mixed plane or volume may be random or ordered, in order to optionally favour one or more angles of reflection and/or of refraction of light rays coming from the LED.

Advantageously, the light rays coming from the mixed plane or volume have an angle of incidence at the LED surface facing and opposite the first face of the structured layer or at a face of the LED in contact with its external environment which is within a range of values which favours their extraction from said LED. This range of values depends on the refractive indices of the layers making up the LED device as well as on their arrangement in space. For example, the light rays which are incident on a surface of the LED may have a range of values between −40° and +40° or between −24° and +24°.

There may optionally be a hole-stopping layer present between an active layer and a p-type doped layer. This layer may comprise the same elements as the active layer, in different proportions.

The composition of at least one above layer may comprise one or more elements in common with the specific layer, such as, for example, indium gallium nitride, so that the lattice parameters between these layers are identical or similar or close. Preferably, the value x in a compound of gallium nitride and nitrogen ($Ga(x)In(1-x)N$), varies between 0.05 and 0.2. In this way the lattice mis-match zones present at the interfaces of these various layers are minimised or reduced. The thickness of the first layer and/or of the active layer and/or of the second layer making up an electroluminescent device may then be reduced or increased in order to reduce the cost of manufacture and/or to optimise the efficiency of said device.

An electrical contact may be connected to the first and/or second layer.

A semi-conductive and semi-transparent layer may separate an electrical contact and the first and/or the second p-type doped layer.

A source of electrical voltage may be connected to the first and the second layer, respectively n-type doped and p-type doped or conversely. The active layer separating these layers may then emit light when the source of voltage is operated. The incident light ray or rays mentioned above may thus be emitted by the above active layer.

In other words, the invention also relates to a light-emitting device of the electroluminescent diode or LED type, resting on or in contact with one of the above structured substrates. This advantageously allows the light emitted by the active layer to back-scatter, in order to increase the percentage of the light emitted to the exterior of the electroluminescent device.

The invention also relates to a method for manufacture of an above structured substrate, comprising the following steps:
  deposition of a layer made of a first material A on a front face of a host substrate,
  deposition of a second material B so that the first material A and the second material B form, in a plane called the mixed plane, an alternating series of surfaces.

Optionally the step for deposition of the second material may be preceded by a step for removal of part of the material A, so that it is not of homogeneous thickness. It should be recalled that in the present document thickness is defined as being the distance separating the largest surfaces of a layer or of a set of stacked layers, which are facing and optionally parallel to each other. The thickness may be defined along an axis which is perpendicular or substantially perpendicular to the front face of the host substrate.

The deposition of these materials can be carried out by means of sputtering.

An etching technique may be lithography or photolithographic etching.

The first and the second material form a structured layer as defined above.

In other words, the removal of material in a layer of material A and/or covering it by a material B is achieved so as to obtain at least one mixed plane or one mixed volume.

The manufacturing process may comprise a step for mechanical and/or chemical polishing of the structured layer, at least at a face which is parallel or substantially parallel to the front face of the host substrate. The step for formation of the structured layer may be preceded by a step for the deposition of a metallic layer, for example made of tungsten, or a dielectric multi-layer, on the front face of the host substrate by similar means.

The dielectric multi-layer may comprise the following elements: alumina ($Al_2O_3$) and silica ($SiO_2$); or titanium oxide ($TiO_2$) and silica.

Optionally, the above metallic layer or the dielectric multi-layer may be deposited or formed on the first material A, before being covered with the second material B. Thus the metallic layer or the dielectric multi-layer may separate the first and the second material.

A specific layer, as described above, may then be deposited, or held, on the structured or back-scattering layer. Preferably the specific layer is made of a material C which is different from material A and from material B of the structured layer.

Advantageously, this specific layer may be transferred onto the structured layer, in accordance with a layer transfer technique or a technique which comprises a molecular adhesion step. This specific layer may be relaxed.

In this way the structure of the specific layer is not stressed, or in other words its lattice parameter is non-deformed or homogeneous.

The specific layer may then be covered with a multi-layer structure, for example of the LED or electroluminescent diode type.

The specific layer may advantageously be a layer which comprises gallium and/or indium and/or nitrogen, preferably an alloy composed of these three elements. The fact that this layer is in a relaxed state favours the growth on one of its faces, for example by an epitaxy method, of a first layer of a close or similar composition, n-type doped or p-type doped respectively.

For example, this first layer may be composed of indium gallium nitride ($In_xGa_{1-x}N$). Thus the lattice mismatch zone between these layers is reduced or minimised. In other words, a reduction in the stresses between these layers allows the required thickness of the first layer to be reduced, so that its lattice parameter is homogeneous at a first face, facing and opposite the specific layer. This represents a time saving and therefore a reduction in costs during its formation.

In the same way, and for the same reasons as above, an active layer may be formed on the first layer. Advantageously, the active layer and the first layer are of similar composition. It is thus possible to form an active layer faster, and optionally of greater thickness, allowing a reduction in the current density in the active layer due to geometric effects and thus minimising the Auger effect.

A second layer, p-type or n-type doped respectively, of composition similar or close to the first layer and/or the active layer, may also be formed by epitaxy on the active layer.

Metallic contacts may be connected to at least one of the two doped layers of different type, separated by an active layer.

A source of electrical voltage may be connected to the metallic contacts in order to allow the charges of opposite sign to combine in the active layer and thus emit light rays.

The non-stressed specific layer deposited on the structured layer advantageously allows a multi-layer structure of the LED type to be formed, wherein the lattice parameters of the layers are identical, close or similar. It is thus possible to reduce the thickness of the doped layers, which represents a time saving and a financial saving. The thickness of the active layer may also be increased in order to improve the photon emission efficiency.

The invention also allows an LED type structure to be made on a back-scattering support; in this case one of the above structures, with no turning step which could damage said structure.

In other terms, the invention also relates to a method for manufacturing a light emitting device, comprising a multi-layer LED-type structure, arranged on one of the above mentioned devices for back-scattering of an incident ray, comprising a step for formation by epitaxy of a first layer which belongs to a multi-layer structure of the LED type in contact with or on the specific layer.

Advantageously, the specific layer allows a multi-layer structure of the LED-type with a reduced thickness to be formed by epitaxy.

BRIEF DESCRIPTION OF THE DRAWINGS

Other details and characteristics of the invention will become apparent from the following description, made in association with the following appended figures.

Identical, similar or equivalent parts of the various figures bear the same references so as to facilitate moving from one figure to another. In order to make the figures more readable, the various parts shown in the figures are not necessarily shown at a uniform scale. The reference frames shown on the figures are orthogonal.

The FIGS. 6A to 6D show a profile view of a structured substrate, composed of a host substrate, covered by a structured layer.

Figure 1:
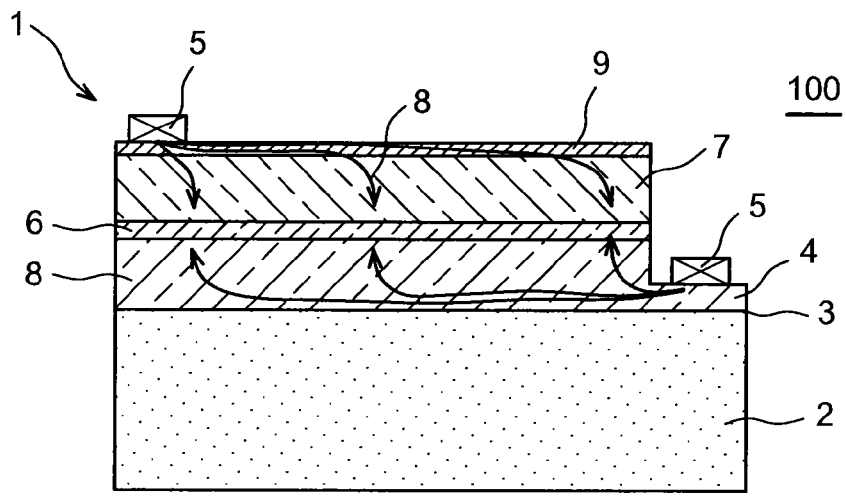
FIG. 1 shows a profile view of an LED-type device according to the state of the art.
Figure 2:
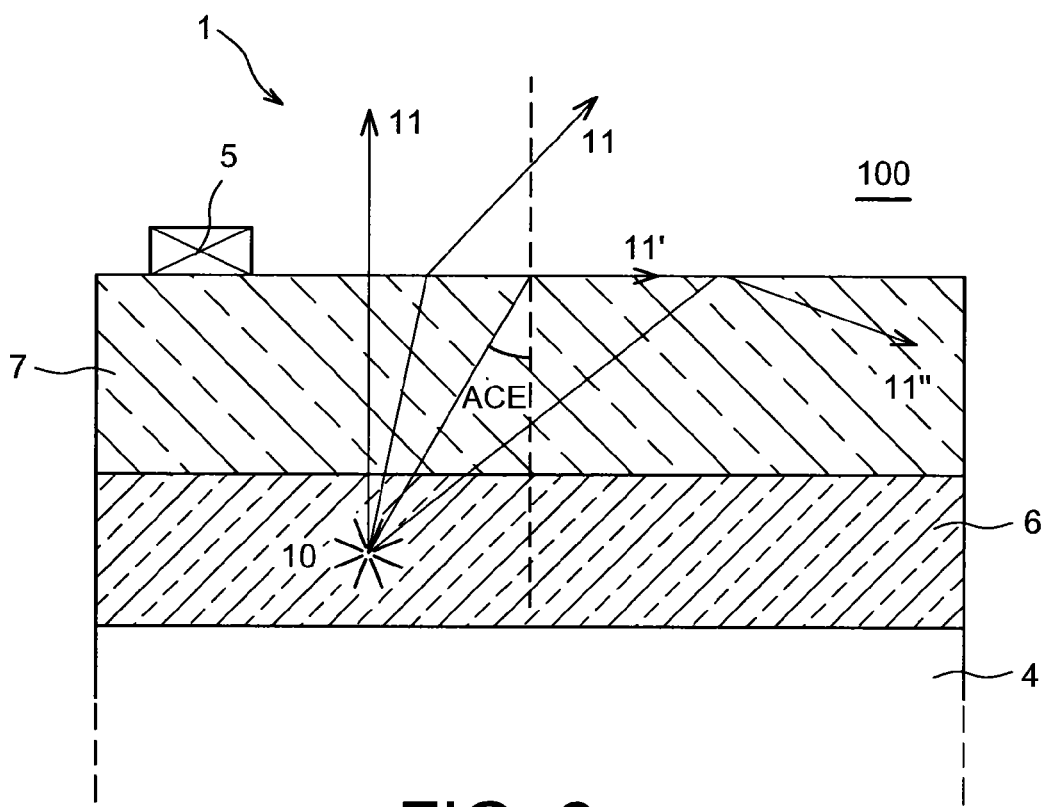
FIG. 2 shows a profile view of an LED-type device according to the state of the art, wherein a part of the light is trapped in the device.
Figure 3:
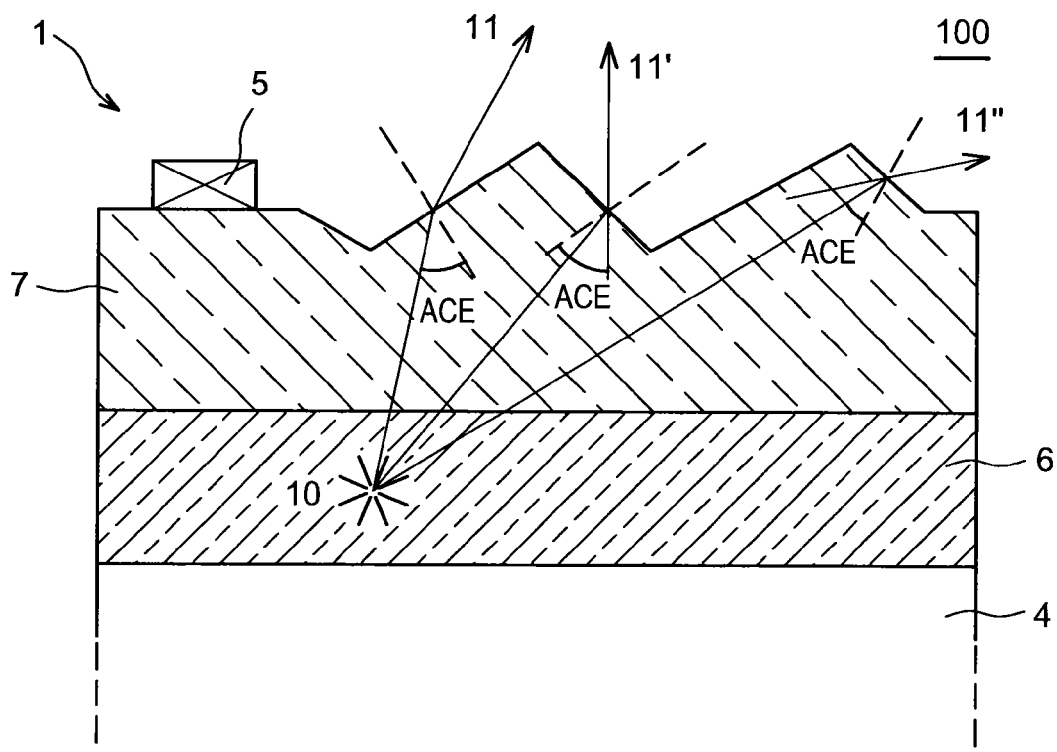
FIG. 3 shows a profile view of an LED-type device according to the state of the art, where the front face is structured in order to allow better extraction of light from the device.
Figure 4:
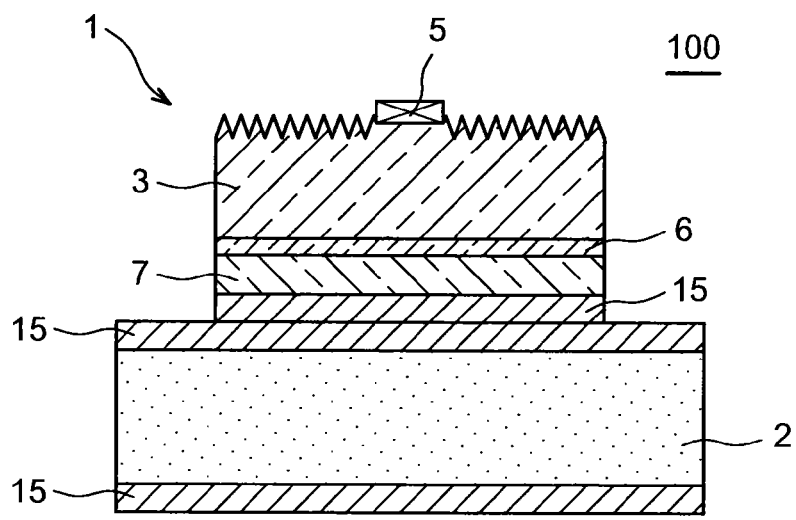
FIG. 4 shows a profile view of another LED-type device according to the state of the art, whose front face is structured.
Figure 5:
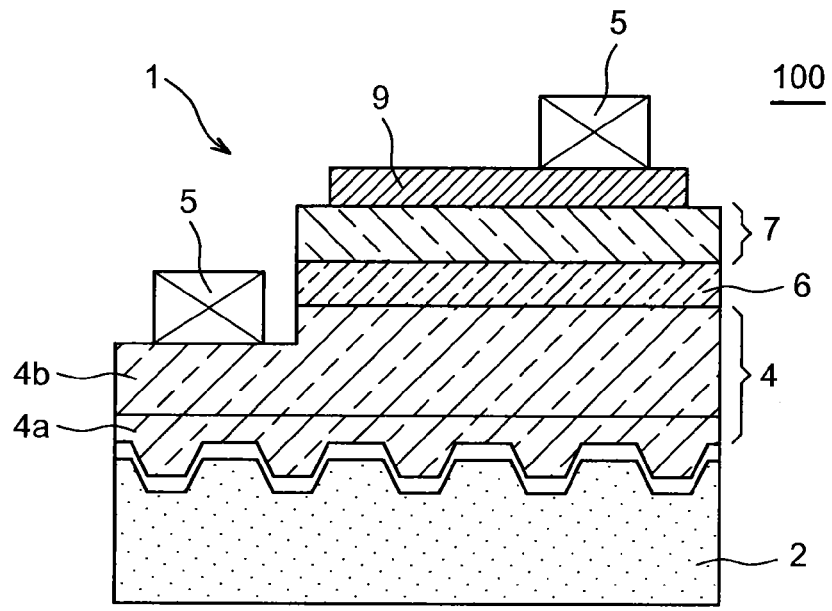
FIG. 5 shows a profile view of an LED-type device according to the state of the art, wherein the LED/substrate interface is structured.
Figure 6A:
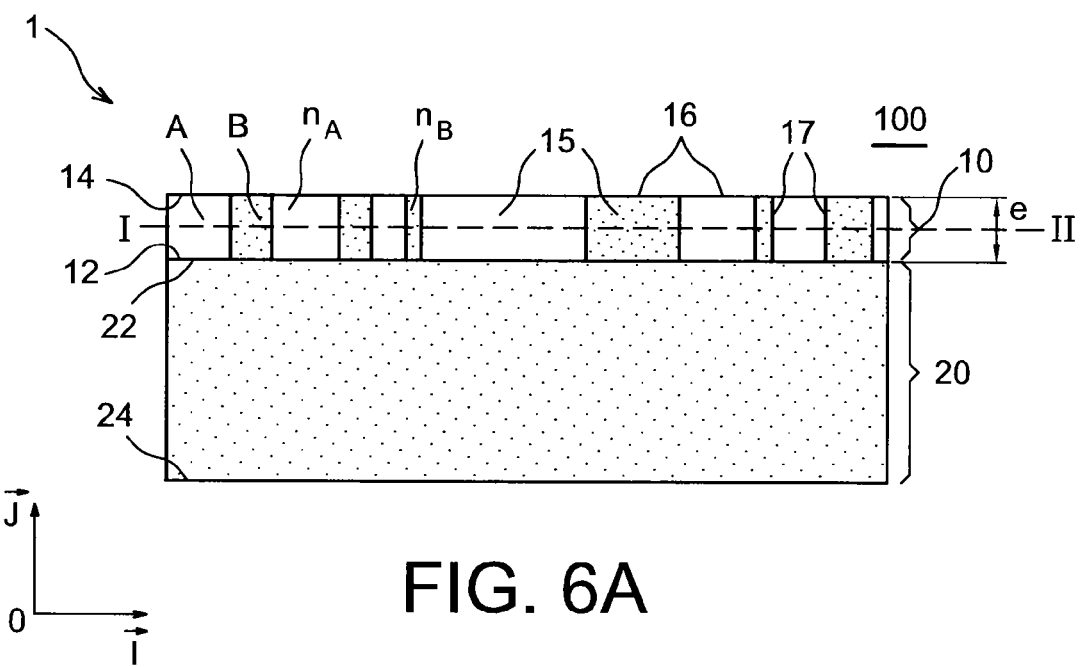
Figure 6B:
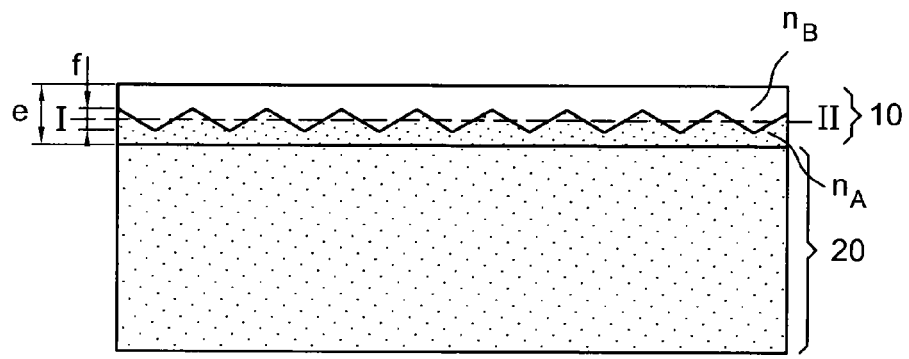
Figure 6C:
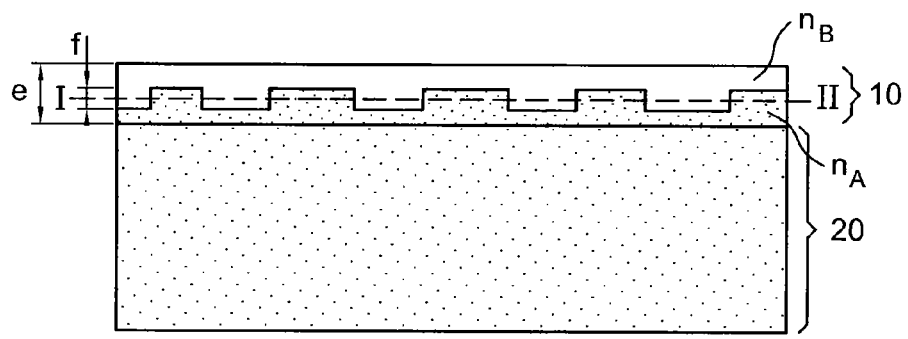
Figure 6D:
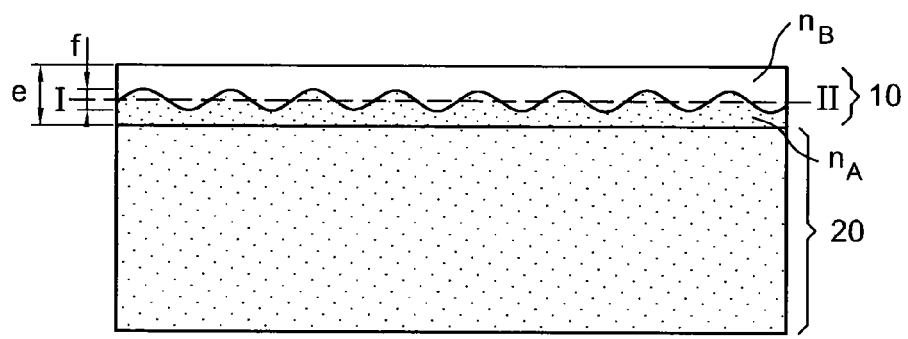
Figure 7:
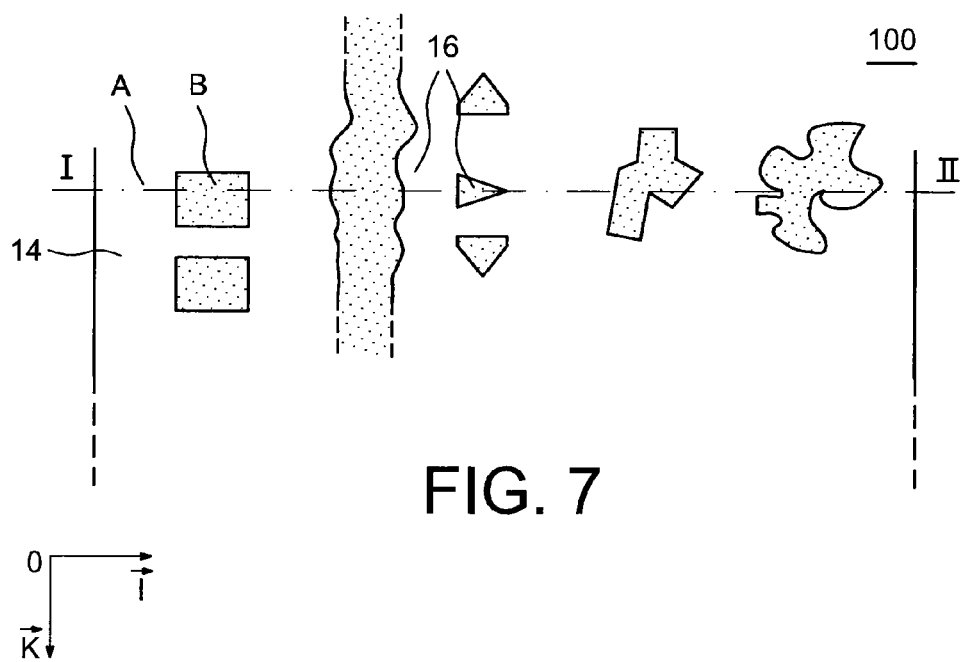

FIG. 7 shows a top view of a mixed plane, belonging to one of the devices in FIGS. 6A to 6D.

Figure 8:
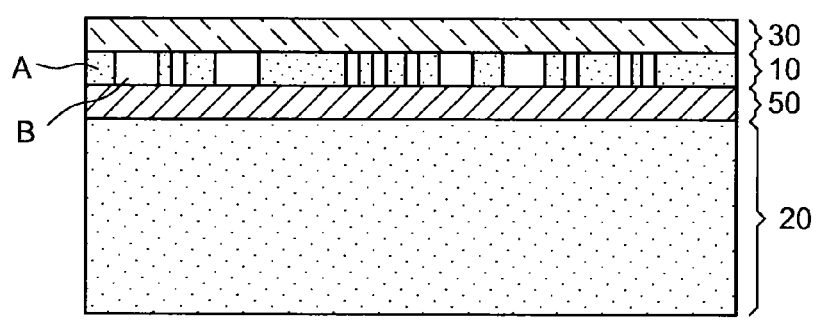

FIG. 8 shows a profile view of the device in FIG. 6 which comprises a metallic layer between the host substrate and the structured layer.

Figure 9:
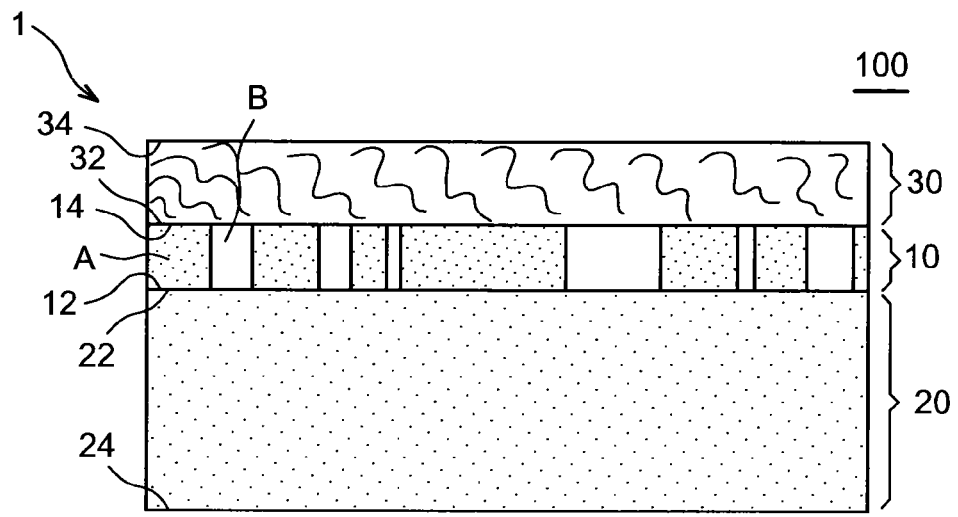

FIG. 9 shows a profile view of a structured substrate composed of a host substrate covered by a structured layer and a specific layer.

Figure 10:
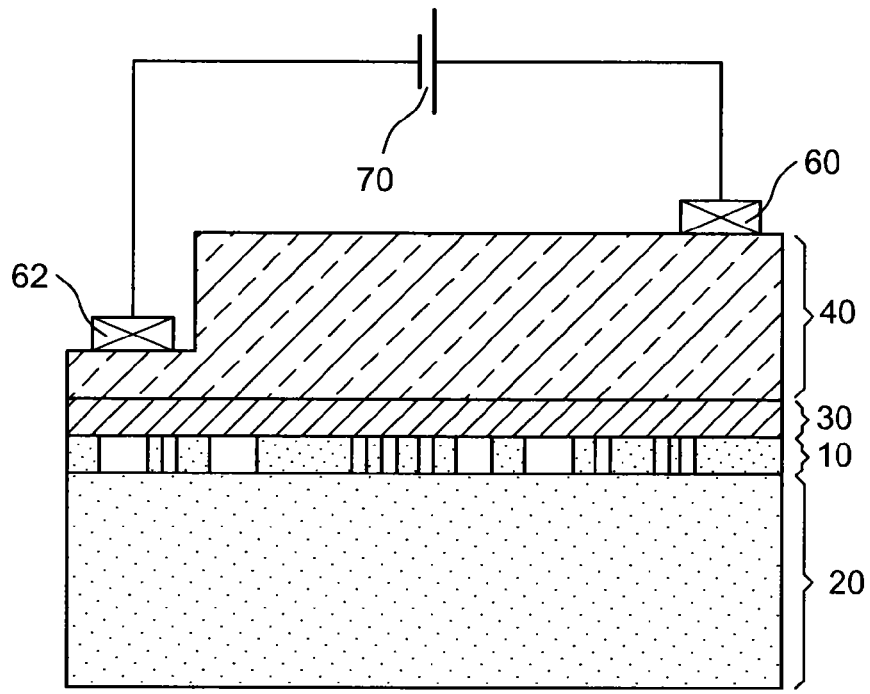

FIG. 10 shows a profile view of the device in FIG. 8 covered by a stack of layers and comprising electrical contacts linked to a source of voltage.

Figure 11:
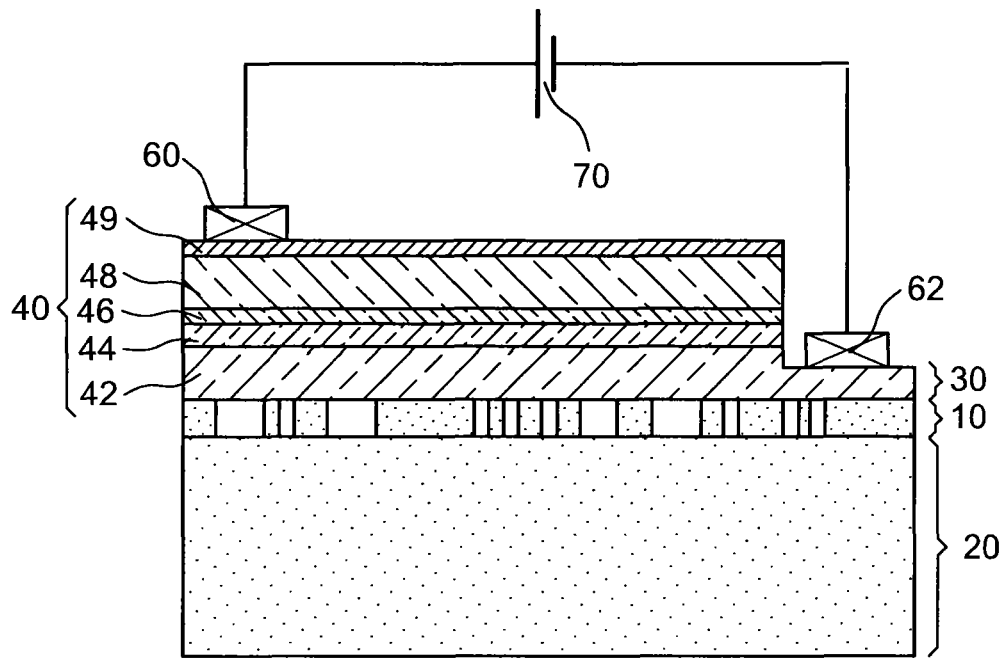

FIG. 11 shows a profile view of the device in FIG. 10 where details of the stack of layers are shown.

FIGS. 12A to 12F show the steps in a method for creating a structured substrate according to the invention.

Figure 12A:
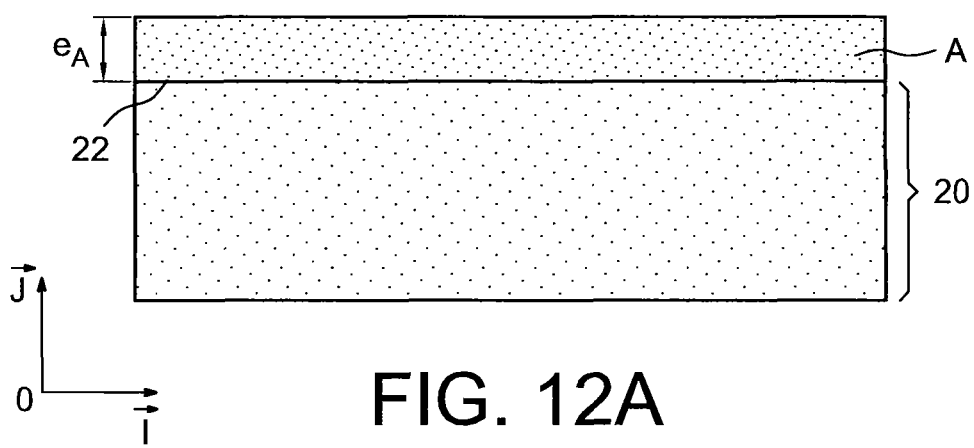
Figure 12B:
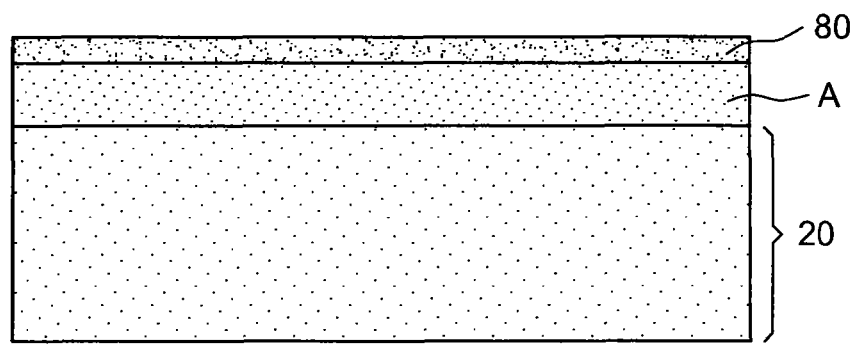
Figure 12C:
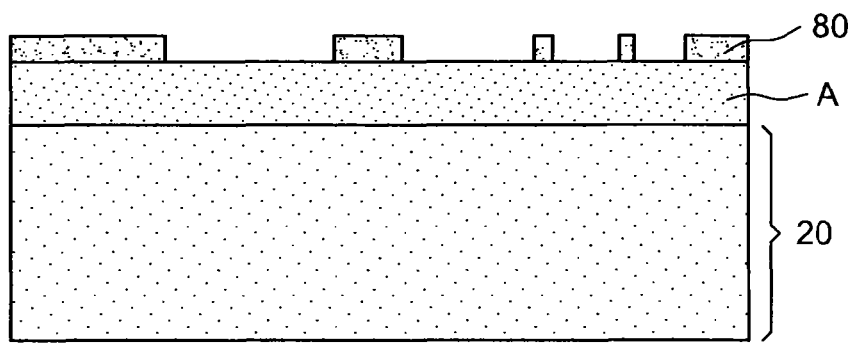
Figure 12D:
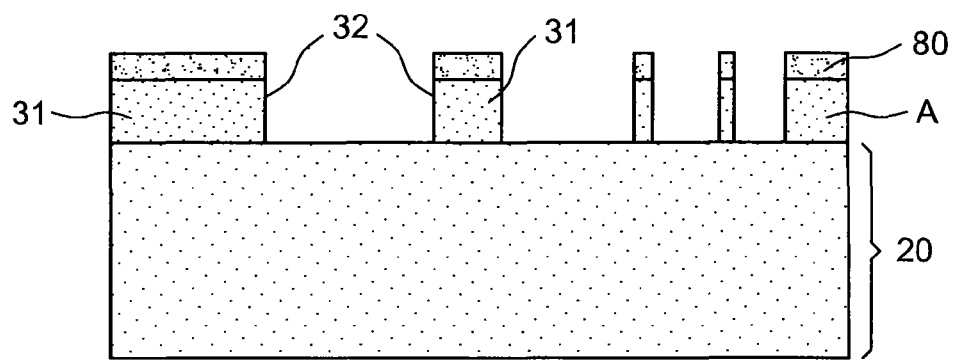
Figure 12E:
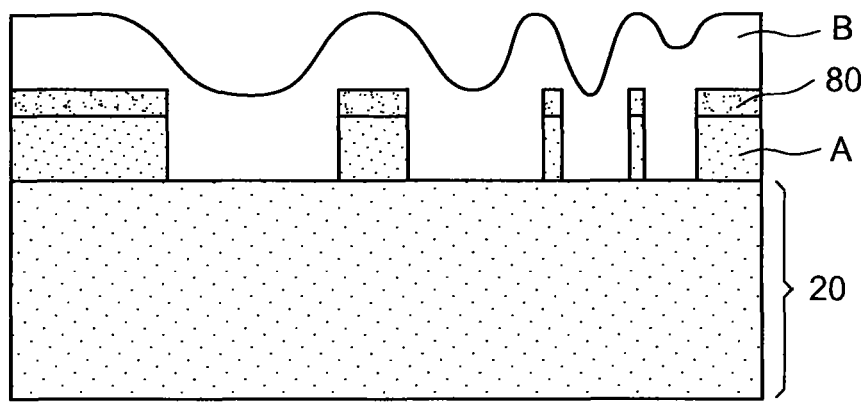
Figure 12F:
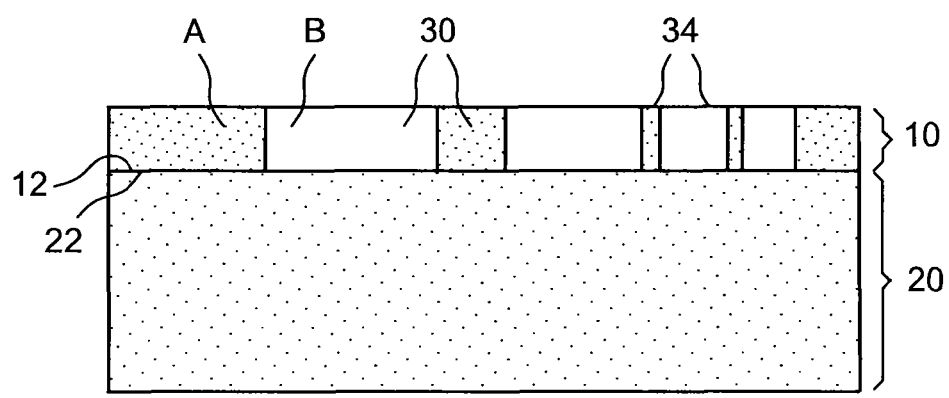
Figure 12G:
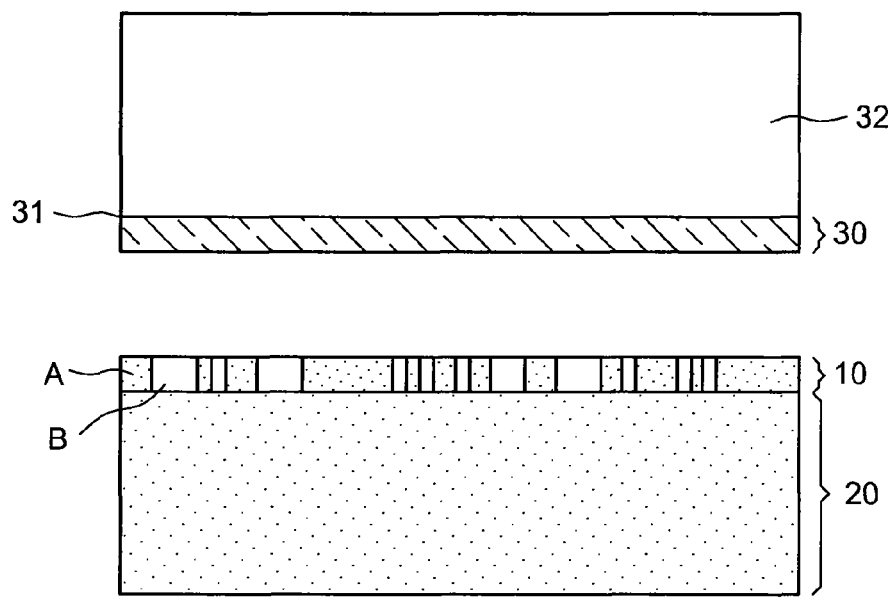
Figure 12H:
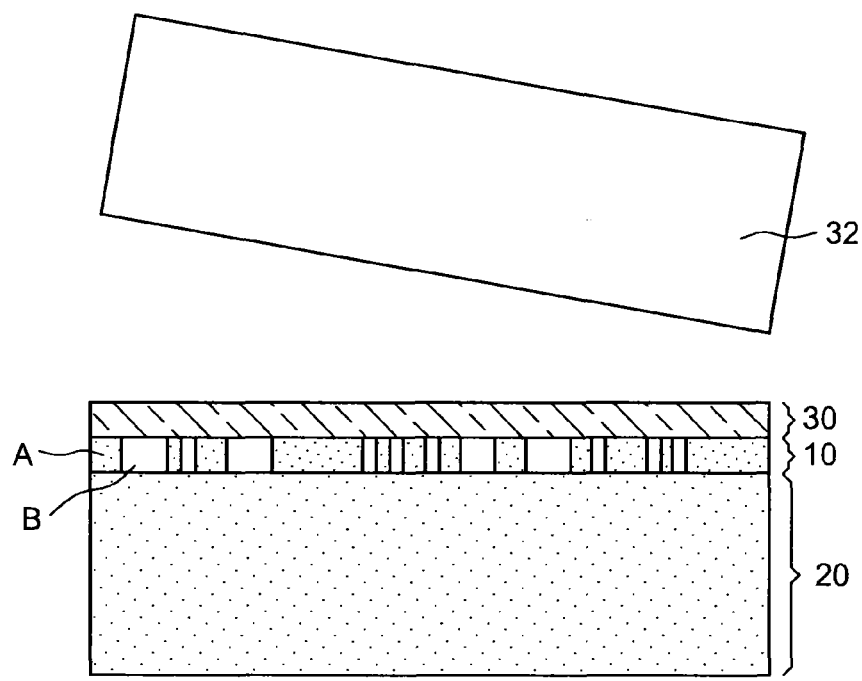

FIGS. 12G to 12H represent the steps for transferring a specific layer onto a structured substrate.

DETAILED DESCRIPTION OF SPECIFIC EMBODIMENTS

A model for the manufacture of an optical back-scattering device, according to the invention, comprising a structured layer 10 in contact with a host substrate 20 is described hereafter.

The structured layer 10 comprises a first face 12 which is parallel or substantially parallel to a second face 14 (FIGS. 6A to 6D). The first and/or the second face may be flat or substantially flat, so as to facilitate contact with another flat face. The first and the second face may be separated by a distance e, of between a few nanometers and a few microns, or between a few nanometers and several hundred nanometers, preferably between 50 nm and 500 nm.

The structured layer 10 comprises at least one plane, called the mixed plane, which comprises at least one first and one second material whose refractive indices are different. Hereafter the first material is designated by the letter A (of refractive index $n_A$) and the second material by the letter B (of refractive index $n_B$).

The difference between the indices $n_A$ and $n_B$ may be greater than 10%, in order to create a variation of the refractive index in the mixed plane along one or two directions. The value of the refractive index $n_A$ may be less than the refractive index $n_B$, where the latter has a value greater than 2, preferably between 2 and 2.45; the value of the refractive index $n_A$ may be less than 2, preferably less than 1.6.

Preferably, the mixed plane is parallel or substantially parallel to the first face 12 and/or the second face 14.

The distance which separates a mixed plane from the first surface 12 and/or from the second surface 14 may be between 0 and 500 nm. For example, a mixed plane may include the straight line (I,II) shown on FIGS. 6A to 6D.

The structured layer may include several mixed planes in contact with and parallel to each other, so as to form a mixed volume (FIG. 6A to 6D). The thickness f of this mixed volume is defined along a direction which is normal to one of the mixed planes of which it is composed. Its thickness f may be between 0 and the thickness e of the structured layer 10 so as to include the first and/or the second face of said layer (FIG. 6A).

According to an alternative, the mixed volume has a thickness f which is less than the thickness e of the structured layer, with the surfaces 12 and 14 not being included in said volume (FIGS. 6B to 6D). The value of f is, for example, between 50 nm and 500 nm. The mixed volume is preferably placed as close as possible to the second surface 14 of the structured layer.

The material which has the greater refractive index of material A and material B is the closest to the specific layer or at least at the same distance from said layer as the other material.

The interface between the first and the second material in the mixed volume, along a transverse section, may be peak-shaped (FIG. 6B), notch-shaped (FIG. 6C) or wave-shaped (FIG. 6D).

The above zones A and B alternate along at least one or more dimensions in order to back-scatter a light ray which is incident on a mixed plane or a mixed volume. The term back-scattering designates both the phenomenon of optical diffusion and/or refraction of a light ray that is incident on a mixed plane or on a mixed volume.

These alternating zones A and B are not necessarily periodic, and their arrangement may be different from that of the photonic crystals. The materials A and B may be arranged so as to form a random or Archimedes' geometrical paving, at least at the mixed plane. In other words, a mixed plane or a mixed volume comprises zones of different optical indices so as to form a random network.

The shapes of these patterns 16 may be amorphous or polygonal (square and/or rectangular and or triangular and/or hexagonal shaped) or may not include any angles (for example oval or circular shapes) in a plane which is parallel to the surface 22 of the substrate 20 (FIG. 7). In order to ensure simplicity of technological manufacture circular patterns may be preferred.

The dimensions of the patterns 16 measured at least in one mixed plane may be between 50 nm and 5 µm or between 50 nm and 1 µm or between 50 nm and 500 nm or between 50 nm and 200 nm. Preferably these dimensions are of the order of the wavelength of the incident ray that it is desired to back-scatter. The dimensions are preferably measured along at least one axis included in the mixed plane.

The zones of different refractive index may be bounded by walls 17 which are perpendicular or substantially perpendicular to the faces 12 and 14 of the structured layer (FIG. 6A). The walls 17 and the surfaces 16 therefore delimit volumes 15 which may optionally pass through the structured layer 10 in order to reach the face 12 and/or the face 14.

At least one of these zones, for example zone B, may be composed of a material B which absorbs less than 30% of a light ray with a wavelength of between 300 nm and 800 nm, preferably between 360 nm and 580 nm, passing through the structured layer 10 and passing only through this zone. In other words, this zone B may have a refractive index whose imaginary part is the least possible, so that the loss of intensity of the light ray passing through the structured layer, through this zone of material B, does not typically exceed 30%.

The zones whose refractive indices are different may be made from one of the following semi-conductive elements: titanium oxide ($TiO_2$), silica ($SiO_2$), zinc sulphide (ZnS), zinc oxide (ZnO), tantalum oxide ($Ta_2O_5$). These materials are transparent or partially transparent at the wavelengths of the light rays that it is wished to reflect, for example in the visible region and/or in the near ultra-violet. These materials may have a refractive index which is close to or identical to that of the LED layers comprising gallium nitride (GaN).

The first face 12 of the structured layer is in contact with a front face 22 of the host substrate 20. This host substrate is made from a single or composite material which supports a stack of several layers to form a device which emits light rays, preferably in the ultra-violet and visible region. Such a device may be, for example, electroluminescent, of the diode or LED type.

Advantageously the host substrate 20 may be made from at least one material which favours the exchange of heat between its various faces, in order to remove heat from the structured layer more easily. It may be formed from the following elements: sapphire, alumina, silicon, aluminium nitride or silicon carbide-mono- or polycrystalline.

The host substrate and the structured layer form a structured substrate 1 (FIGS. 6A to 6D). Advantageously, it may be composed of materials which are totally or very insensitive to the later steps involving the formation of a multi-layer structure on the structured layer 10.

The structured layer may comprise a metallic layer 50, interposed between the structured layer 10 and the host substrate 20 (FIG. 8). The metallic layer limits or prevents the transmission of a light ray from the structured layer towards the host substrate. This layer may have a thickness of greater than 100 nm and be made from a material which can withstand the steps in the formation of a multi-layer structure of the LED type. This material may be, for example, tungsten (W), or molybdenum (Mo) or tantalum (Ta) or niobium (Nb), or chromium (Cr) or titanium (Ti) or silicon (Si) or titanium nitride (TiN).

One of the above metallic layers may be replaced by a dielectric multi-layer which comprises the following elements: alumina ($Al_2O_3$) and silica ($SiO_2$); or titanium oxide ($TiO_2$) and silica ($SiO_2$).

A specific layer 30 may cover the second face 14 of the structured layer 10 (FIG. 9).

Preferably this layer 30 is flat and comprises a first face 32 parallel or substantially parallel to a second face 34. These two faces may be separated by a distance of between a few nanometers and several hundred nanometers; advantageously the thickness of this layer is less than 500 nm or 1 µm. The first face 32 is in contact with the second face 14 of the structured layer 10. The specific layer may be crystalline, semi-conductive and made of nitride or of indium gallium nitride: $In_x Ga_{(1-x)}N$. The variable x represents the atomic proportion of indium. This may be less than 30% or 20% or 10% and typically it is of the order of 5%. It may also be gallium nitride.

The specific layer 30 may also be covered with a multi-layer structure 40 comprising semi-conductive crystalline structures (FIG. 10).

The multi-layer structure 40 may comprise at least one active layer 44 whose thickness may be between a few nanometers and several hundred nanometers, preferably between 2 and 100 nm (FIG. 11). An active layer is characterised by the presence of several quantum wells which allow electron-hole pairs to combine whilst emitting light, preferably between 360 nm and 700 nm. For example, an active layer may be made from indium gallium nitride of composition $In_xGa_{(1-x)}N$. The indium content of the quantum wells is chosen so as to emit light at the desired wavelength, for example on a 5% indium-based layer, where x is equal to 17%, the active layer then emits at 450 nm.

A first layer 42 in contact with the specific layer 30 may advantageously have a lattice parameter which is identical or which is similar to that of the specific layer and its thickness may be between a few nanometers and several microns, preferably greater than 500 nm, in order to offer good crystalline quality and/or a homogeneous structure, at its surface in contact with the active layer 44.

The multi-layer structure 40 may comprise at least one first n-type doped layer 42 and a second p-type doped layer 48, separated by at least one active layer 44. The thickness of these layers may be greater than 100 nm or than 200 nm or 500 nm and less than 1 μm.

A hole-stopping layer 46 may also be placed between a second p-type doped layer 48 and an active layer 44. This layer 46 may comprise the same elements as the active layer 44 but in different proportions, or may comprise a fraction of aluminium.

Advantageously the specific layer 30 and the stack of layers 40 which cover it are made from materials which are in common, or similar or identical, for example nitride-based, more specifically indium gallium nitride $In_xGa_{(1-x)}N$ based, or optionally from an alloy of $Zn_xMg_{(1-x)}O$, where the value x may be between 5% and 20% for InGaN and between 0 and 20% for ZnMgO.

A semi-conductive and semi-transparent layer 49 may cover the second layer 48 of the stack 40, if this is a p-type doped layer.

One of the above multi-layer structures may comprise a first metal contact 60 connected at or on the second layer 48 and a second electrical contact 62 connected to the first layer 42 of the stack. The two connected layers are separated by at least one active layer 44.

The invention also relates to a technique for the manufacture of one of the above devices.

A manufacturing method may include a first step for deposition of a material A, for example of silica ($SiO_2$), on a flat face 22 of a host substrate 20 (FIG. 12A). This deposit may be made in the form of a layer using sputtering-type means. The thickness of the layer of material A may be greater than a few nanometers or greater than 50 nm or greater than 100 or greater than 500 nm.

A layer of photosensitive resin 80, of conventional photolite type (resin SJR 1818 from the Shipley company), can cover this first layer before being partially exposed to a light source passing through a mask, in order to delimit the surfaces 16 of the zones 15 (FIG. 12B).

The non-exposed parts are then chemically attacked when they are immersed in a first bath used to etch the photolite resin (FIG. 12C).

Using RIE ("Reactive Ion Etching") dry etching based on a blend of CHF3 and $O_2$ in a ratio of 10:1, the surfaces not protected by the layer 80 are etched in order to remove the material A, partially or completely, between the pillars 31 (FIG. 12D). It is possible to control the depth of the etching according to the etching time. The removal of material A may optionally be non-homogeneous and/or incomplete, in order to obtain the layers profiles shown in FIGS. 6B to 6D, for example.

Then a layer of a second material B may be deposited in the same manner as the material A.

This layer of material B may cover the layer 80 so as to at least partially fill the cavities between the pillars 31 (FIG. 12E). The material B may be based on titanium oxide ($TiO_2$).

The layers covering the front face 22 of the substrate 20 are then mechanically and/or chemically polished. Preferably the polishing conditions are selected so as not to create additional topologies between materials A and B (FIG. 12F).

Polishing is carried out so that the surface 14 of the structured layer 10 is flat, in order to optionally favour contact with another flat plane.

The titanium oxide may be replaced by zinc sulphide (ZnS) or zinc oxide (ZnO).

According to one alternative the above process may include a step for the deposition of a metallic layer 50 between the host substrate 20 and the structured layer 10, and/or between the layer of material A and the layer of material B. This metallic layer is preferably resistant to heat treatment, in order to grow a first semi-conductive layer 42 on the specific layer 30 using epitaxy. The metallic layer may be tungsten-based. Other metals may be employed, characterised by improved reflectivity after having undergone heat treatment, such as, for example molybdenum (Mo), or tantalum (Ta), or niobium (Nb) or chromium (Cr), or titanium (Ti) or silicon (Si) or titanium nitride (TiN).

One of the above metallic layers 50 may be replaced by a dielectric multi-layer which comprises the following elements: alumina ($Al_2O_3$) and silica ($SiO_2$); or titanium oxide ($TiO_2$) and silica ($SiO_2$).

The FIGS. 12G and 12H illustrate a technique for transferring a specific layer 30 onto the structured layer 10, according to a layer transfer technique. The transfer technique may comprise a relaxation step, as described in document EP2151852A1. This layer transfer technique involves growing a first layer by epitaxy on a support 32 in order to form a donor substrate. Alternatively a one-piece donor substrate can be employed. An ionic implantation step is then used to form a fragile interface in the donor substrate or in the support 32 or the epitaxy-treated layer 30 when the donor substrate comprises such a layer. This is transferred onto the target support, here the structured support 10, notably by assembly using molecular adhesion, before being detached from the support at the fragile zone (FIGS. 12G and 12H). The layer 30 is preferably made from indium gallium nitride or from gallium nitride or from silicon (1,1,1,) or from silicon carbide.

This process allows in particular a relaxed layer to be obtained which contains a non-zero fraction of indium, for example of the order of 5%, as is described for example in document EP2151852A1.

According to a known alternative layer-transfer technique, a donor substrate is assembled onto the target support, and thinned by mechanical or chemical abrasion in order to form the layer 30. The assembly is preferentially made using molecular adhesion.

Preferably, the specific layer 30 and the layers making up the multi-layer structure 40 have an identical or close or similar lattice parameter, to allow or to favour the formation of the structure 40 by epitaxy.

The lattice mis-match compensation zones between these layers are therefore reduced or even non-existent, in the case where the composition of the first layer 42 and of the layer 30 are identical.

Electrical contacts 60, 62 may be made, directly or after a step for shaping of the multi-layer structure 40, on two doped layers which are separated by an active layer 44.

When an electrical voltage is applied to a multi-layer structure comprising an active layer 44, the active layer emits light rays in all directions. The light rays which are incident on the structured layer 10 are reflected or back-scattered by surfaces 16 and/or zones 15, along random or favoured directions, thus increasing the number of photons which have a suitable angle for leaving the device.

One of the advantages of the invention is that it allows the choice of host substrate and of the structured layer to be optimised in order to reflect light rays more effectively at the structured layer: surfaces 16 and/or zones 15.

The structured zone allows the restrictive conditions for the host substrate to be overcome. In effect, the structured layer strongly limits optical phenomena between the host substrate and the light emitting device present on the structured layer.

It is no longer necessary therefore to etch the host substrate or to be restricted to light-reflecting materials. The host substrate can be chosen according to new criteria such as, for example, its effectiveness in dissipating the heat produced at the light emitting device.

The invention also allows easier transfer of the specific layer onto the structured layer in comparison with a metallic layer. This means that molecular adhesion techniques may be employed which do not require an increase in temperature of said layers.

It also allows epitaxy steps to be delayed, in order to form the multi-layer LED structure after the transfer step, thus reducing the impact of a costly step.

Furthermore, according to the invention, the doped layers making up the light emitting device may not be structured. Thus degradation of their electrical properties can be avoided.

Conversely, structuring may be carried out at the n-type, rather than p-type, doped layer, thus optimising the contact made on the p layer and thus optimally favouring the introduction of carriers into the multi-layer structure.

The invention claimed is:

1. A device for back-scattering of an incident light ray, comprising:
   a host substrate;
   a structured layer comprising:
     a first face which faces a front face of the host substrate,
     a second, flat, face provided on a light incident side of the device and which is parallel or substantially parallel to the first face, and
     a first material A and a second material B, which form, in a mixed plane, alternating surfaces which form random structured patterns with dimensions of these surfaces being between 350 nm and 600 nm, or of an order of the wavelength of the incident light along the mixed plane, wherein the mixed plane is between the first and second face of the structured layer, and the refractive index of the first and of the second material are different; and
   a specific layer covering the structured layer such that a boundary between the specific layer and the structured layer is flat, the specific layer being made of a material C which is different from material A of the structured layer and also different from material B of the structured layer, wherein the specific layer is crystalline and semi-conductive, with a thickness of less than one micrometer, or less than 500 nm.

2. A device for back-scattering of an incident light-ray according to claim 1, wherein the difference in refractive index between the specific layer and the refractive index of the second material B is less than 30%.

3. A device for back-scattering of an incident light ray according to claim 1, wherein the specific layer comprises gallium nitride, or silicon carbide, or silicon, or indium gallium nitride.

4. A device for back-scattering of an incident light ray according to claim 1, wherein the first face and the second face of the structured layer are separated by a distance of between 50 nm and 500 nm.

5. A device for back-scattering of an incident light ray according to claim 1, wherein the refractive index of the first material A is less than the refractive index of the second material B, the refractive index of the first material A being less than or equal to 1.6.

6. A device for back-scattering of an incident light ray according to claim 1, wherein the second material is in contact with the specific layer.

7. A device for back-scattering of an incident light ray according to claim 1, wherein the first material A or the second material B absorb less than 30% of the light ray.

8. A device for back-scattering of an incident light ray according to claim 1, wherein the first material A and the second material B alternate in the mixed plane along one or two dimensions.

9. A device for back-scattering of an incident light ray according to claim 1, wherein plural mixed planes are in contact with and parallel to each other, to form a mixed volume in the structured layer.

10. A device for back-diffusion of an incident light-ray according to claim 9, the mixed volume comprising the first surface and/or the second surface of the structured layer.

11. A device for back-scattering of an incident light ray according to claim 1, wherein the first and/or the second material is titanium oxide, or tantalum oxide, or zinc oxide or silica.

12. A device for back-scattering of an incident light ray according to claim 1, wherein a metallic layer or dielectric multi-layer is present between the host substrate and the structured layer and/or between the first and/or second material which make up the structured layer, wherein the thickness of this metallic layer and/or of this dielectric multi-layer is between a few nanometers and a few hundred nanometers or less than 150 nm or less than 100 nm.

13. A light emitting device comprising:
    a device for back-scattering of an incident light ray according to claim 1,
    a multi-layer structure of LED type, comprising a first crystalline layer formed on the specific layer, wherein lattice parameters of the first layer and of the specific layer are close or identical.

14. A light emitting device according to claim 13, wherein the first layer has a thickness of more than 500 nm, or of between 100 nm and 1 μm.

15. A light emitting device according to claim 13, wherein the multi-layer structure comprises an active layer which exhibits a thickness of less than 00 nm or 150 nm or 100 nm.

16. A light emitting device according to claim 15, wherein the first layer is n-type doped and wherein the multi-layer structure comprises a second crystalline p-type doped layer with the active layer separating the first and the second layers.

17. A light emitting device according to claim 16, wherein the first and second layers each comprise an electrical contact.

18. A light emitting device according to claim 16, wherein the multi-layer structure comprises a semi-conductive and semi-transparent layer which separates the second layer from its electrical contact.

19. A light emitting device according to claim 16, wherein the multi-layer structure comprises a hole-stopping layer between the first and second layers.

20. A light emitting device according to claim 13, wherein the first layer exhibits a composition which is close to or identical to the composition of the specific layer.

21. A light emitting device according to claim 13, wherein the incident light-ray is emitted by said light emitting device.

22. A method for manufacturing a device for back-scattering of an incident light, comprising:
   forming a host substrate;
   forming a structured layer comprising:
      a first face which faces a front face of the host substrate,
      a second, flat, face provided on a light incident side of the device and which is parallel or substantially parallel to the first face, and
      a first material A and a second material B, which form, in a mixed plane, alternating surfaces which form random structured patterns with dimensions of these surfaces being between 350 nm and 600 nm, or of an order of the wavelength of the incident light along the mixed plane, wherein the mixed plane is between the first and second face of the structured layer, and the refractive index of the first and of the second material are different; and
   a specific layer covering the structured layer such that a boundary between the specific layer and the structured layer is flat, the specific layer being made of a material C which is different from material A of the structured layer and also different from material B of the structured layer, wherein the specific layer is crystalline and semi-conductive, with a thickness of less than one micrometer, or less than 500 nm, the method comprising:
   a) formation of the structured layer such that the first face is in contact with the front face of a host substrate, where step a) comprises:
      a1) deposition of the first material A on said front face;
      a2) deposition of the second material B so that the first material A and the second material B form, in a mixed plane, said alternating surfaces; and
   b) transfer of said specific layer onto the second face of the structured layer.

23. A method for manufacture according to claim 22, wherein a) further comprises a3) mechanical and/or chemical polishing of the structured layer, at the second face.

24. A method of manufacture according to claim 22, wherein a1) is followed by a removal of a portion of the first deposited material A so that its thickness is not homogeneous, and wherein a2) is carried out so that the second material B covers the remaining first material A.

25. A method of manufacture according to claim 22, where b) is carried out by a technique comprising a molecular adhesion.

26. A manufacturing method for a light emitting device, comprising:
   forming a host substrate;
   forming a structured layer comprising:
      a first face which faces a front face of the host substrate,
      a second, flat, face provided on a light incident side of the device and which is parallel or substantially parallel to the first face, and
      a first material A and a second material B, which form, in a mixed plane, alternating surfaces which form random structured patterns with dimensions of these surfaces being between 350 nm and 600 nm, or of an order of the wavelength of the incident light along the mixed plane, wherein the mixed plane is between the first and second face of the structured layer, and the refractive index of the first and of the second material are different; and
   a specific layer covering the structured layer such that a boundary between the specific layer and the structured layer is flat, the specific layer being made of a material C which is different from material A of the structured layer and also different from material B of the structured layer, wherein the specific layer is crystalline and semi-conductive, with a thickness of less than one micrometer, or less than 500 nm,
   a device for back-scattering of an incident light ray,
   a multi-layer structure of LED type, comprising a first crystalline layer formed on the specific layer, wherein lattice parameters of the first layer and of the specific layer are close or identical, the method compising:
      formation by epitaxy of a first crystalline layer belonging to an LED-type multi-layer structure, on said specific layer belonging to said device for back-scattering of an incident light-ray.

27. A manufacturing method according to claim 26, comprising manufacturing a back-scattering device.

* * * * *